(12) United States Patent
Carroll et al.

(10) Patent No.: US 7,163,596 B2
(45) Date of Patent: Jan. 16, 2007

(54) FIBERS AND RIBBONS FOR USE IN THE MANUFACTURE OF SOLAR CELLS

(75) Inventors: Alan Frederick Carroll, Raleigh, NC (US); Christopher John Roach, Apex, NC (US); Che-Hsiung Hsu, Wilmington, DE (US)

(73) Assignee: E. I. du Pont Nemours and Company, Wilmington, DE (US)

( * ) Notice: Subject to any disclaimer, the term of this patent is extended or adjusted under 35 U.S.C. 154(b) by 178 days.

(21) Appl. No.: 10/428,284

(22) Filed: May 2, 2003

(65) Prior Publication Data

US 2004/0009290 A1 Jan. 15, 2004

Related U.S. Application Data

(60) Provisional application No. 60/387,160, filed on Jun. 7, 2002.

(51) Int. Cl.
*B32B 37/00* (2006.01)

(52) U.S. Cl. ............ 156/155; 156/308.2; 156/309.6

(58) Field of Classification Search ............ 156/155, 156/166, 176, 308.2, 309.6
See application file for complete search history.

(56) References Cited

U.S. PATENT DOCUMENTS

| | | | |
|---|---|---|---|
| 3,686,036 A | 8/1972 | Gereth et al. | |
| 3,982,964 A * | 9/1976 | Lindmayer et al. | 136/256 |
| 4,082,568 A | 4/1978 | Lindmayer | |
| 4,222,977 A * | 9/1980 | Dobo | 264/634 |
| 4,235,644 A | 11/1980 | Needes | |
| 4,347,262 A | 8/1982 | Marcus | |
| 4,348,458 A * | 9/1982 | Otstot | 428/366 |
| 4,826,666 A | 5/1989 | Laine | |
| 4,975,104 A | 12/1990 | Kim | |
| 5,385,499 A | 1/1995 | Ogawa et al. | |
| 5,661,041 A * | 8/1997 | Kano | 438/72 |
| 5,674,634 A | 10/1997 | Wang et al. | |
| 5,714,840 A | 2/1998 | Tanabe et al. | |
| 5,723,945 A | 3/1998 | Schermerhorn | |
| 5,851,732 A | 12/1998 | Kanda et al. | |
| 6,120,975 A | 9/2000 | Tokai et al. | |
| 2004/0050476 A1* | 3/2004 | Hsu et al. | 156/89.11 |

FOREIGN PATENT DOCUMENTS

| | | |
|---|---|---|
| EP | 0 951 048 A1 | 10/1999 |
| JP | 10149763 | 6/1998 |
| WO | WO 94/11546 | 5/1994 |
| WO | WO 00/65629 | 11/2000 |
| WO | WO-02/061791 A2 * | 8/2002 |

\* cited by examiner

*Primary Examiner*—Jeff H. Aftergut

(57) ABSTRACT

This invention is directed to a process for the fabrication of features on a silicon wafer utilizing fibers or ribbons comprising organic polymer and inorganic material.

6 Claims, 2 Drawing Sheets

FIBERS AND RIBBONS FOR USE IN THE MANUFACTURE OF SOLAR CELLS

This application claims the benefit of provisional application Ser. No. 60/387,160 filed Jun. 7, 2002.

FIELD OF THE INVENTION

This invention is directed to a fiber or ribbon comprising organic polymer and inorganic materials. The invention is further directed to a process for the fabrication of features on solar cell structures utilizing such fibers or ribbons.

BACKGROUND OF THE INVENTION

A conventional solar cell structure with a p-type base has a negative electrode that is typically on the front side or sun side of the cell and a positive electrode on the backside. The solar cell has a carrier-collecting junction close to its front surface. The front surface is contacted with parallel fingers which are currently about 140 microns wide per finger. The fingers are connected by two bus bars that are perpendicular to the fingers. Typically, a five-inch square cell has about 55 fingers separated by about 2.1 mm spaces. The electric current collected for storage by the solar cell is gathered by metal contacts to a doped region on the front surface and by a second contact to the oppositely doped region on the back surface.

It is difficult to obtain very fine line and space resolution for the formation of the negative electrodes when applied by conventional patterning techniques such as screen printing, sputtering or chemical etching methods. The present invention will allow for the use of fibers or ribbons, wherein conductive metal particles are integrated into the fiber or ribbon, to form such electrodes on the front surface of the solar cell structure. The fibers or ribbons will allow narrower lines with increased height thickness which will increase the cell power by decreasing cell shadowing loss without increasing resistance of the lines. Currently shadowing loss accounts for about 9% loss in a solar cell structure. Narrower lines will substantially decrease such loss.

U.S. Pat. Nos. 3,686,036, 4,082,568, 4,347,262, and 4,235,644 disclose various solar cell devices and methods of manufacture.

SUMMARY OF THE INVENTION

This invention provides a process for the manufacture of electrodes on a solar cell structure comprising the steps of affixing a fiber or ribbon comprising an organic polymer and a conductive material to a substrate such as a silicon wafer in a desired orientation forming a solar cell structure; heating the structure to a temperature above the melting point of the organic polymer; and heating the structure to a temperature to sufficiently effect the essentially complete removal of the organic polymer resulting in the inorganic material affixed to the substrate in the desired orientation.

The invention is also directed to a fiber or ribbon for use in the manufacture of electrodes on the front surface of a solar cell structure comprising conductive particles, dielectric particles or mixtures thereof combined with a polymer suitable for forming a spinnable dispersion.

DETAILED DESCRIPTION OF THE INVENTION

Figure 1:
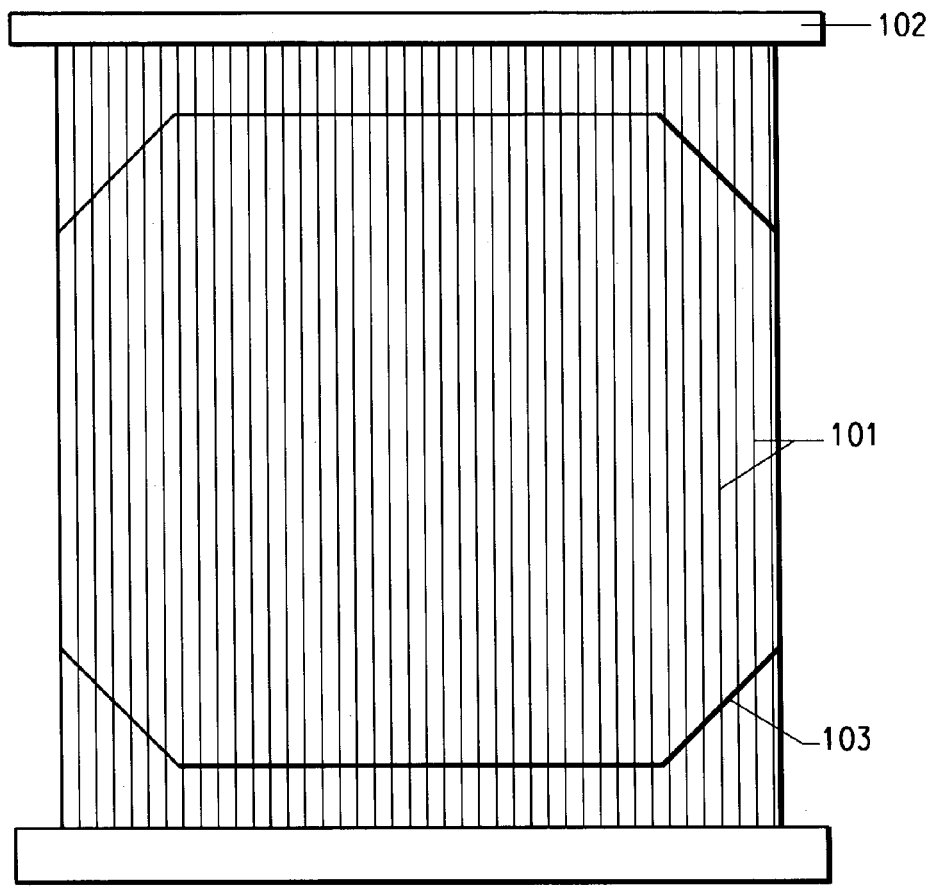
FIG. 1 is an illustration of a top surface metallization of a solar cell.

The present invention is directed to methods for the manufacture of solar cell structures utilizing fibers or ribbons bearing conductive metal particles combined with a spinnable fiber-forming dispersion.

Examples of applications for the fibers or ribbons include the manufacture of features on a solar cell structure, for example, negative electrodes or emitters when the inorganic material of the fiber or ribbon are conductive metal particles.

Polymers suitable for use in the present invention include those that form a spinnable dispersion with particles of inorganic materials such as conducting metal particles. The polymer must be soluble in a suitable solvent so that a dispersion comprising polymer and inorganic material particle can be prepared. The resulting inorganic material bearing polymer dispersion must be capable of being spun into flexible fibers or extruded into flexible ribbons. As used herein, the term "fiber" means a single flexible filament; a group of flexible filaments twisted together or bundled together; or a group of flexible filaments lying parallel to each other forming a bundle. The bundle may or may not be coated to afford protection to the fiber. Cross sectionally, the fiber or bundle may be circular, oblong, square, rectangular, triangular and any other shape. The term "ribbon" means a flexible strip and may be one homogeneous ribbon; or may be constructed by laying more than one fiber in the same plane; or may be several homogeneous ribbons or planes of fibers or combinations thereof layered on top of one another to form a ribbon-like structure. Although preferred that each fiber or ribbon have the same chemical properties, there are some applications that may deem an intermingling of different chemistries of the individual fibers or ribbons. Fiber diameters typically range from 20 microns to 100 microns, but may extend beyond the range for some applications. Ribbon size typically ranges up to 200 microns in width to 100 microns in height but may extend beyond the range for some applications. Length of fiber or ribbon is preferred to be continuous, but noncontinuous fiber or ribbon lengths for forming components is suitable. Further, the polymer must be selected so as to soften and melt cleanly; for example, the polymer must burn out cleanly without leaving behind any residue. The polymer, in the presence of the inorganic material, must exhibit a melting point prior to decomposition. The polymer melt that results from the chosen polymer must wet out the material on which the solar cell is constructed. Examples of polymers that meet the above selection procedure include ethylene/vinyl acetate copolymers, obtainable from the DuPont Company (Wilmington, Del.) under the trade name ELVAX®. Also, polymethylmethacrylate polymers may be suitable in the present invention and are available from the DuPont Company (Wilmington, Del.) under the trade name ELVACITE®. Additional suitable ethylene/vinyl acetate copolymers and polymethylmethacrylate polymers are available from manufacturers such as Dow and Exxon.

Organic solvents for use in the preparation of the spinnable inorganic material/polymer dispersion are characterized by high solubility for the polymer and by high vapor pressure at spinning temperatures to facilitate spinning of the inorganic material into polymer fiber or ribbon. Some examples of suitable solvents include tetrachloroethylene, toluene, and xylenes. Dry spinning is a preferred technique for forming a fiber or ribbon. However, wet spinning, melt or gel spinning can be employed. All techniques are well known by those in the art of fiber technology.

Wet spinning is the oldest process. It is used for fiber-forming substances that have been dissolved in a solvent. The spinnerets are submerged in a chemical bath and as the filaments emerge they precipitate from solution and solidify. Because the solution is extruded directly into the precipitating liquid, this process for making fibers is called wet spinning.

Dry spinning is also used for fiber-forming substances in solution. However, instead of precipitating the polymer by dilution or chemical reaction, solidification is achieved by evaporating the solvent in a stream of air or inert gas. The filaments do not come in contact with a precipitating liquid, eliminating the need for drying and easing solvent recovery.

In melt spinning, the fiber-forming substance is melted for extrusion through the spinneret and then directly solidified by cooling.

Gel spinning is a special process used to obtain high strength or other special fiber properties. The polymer is not in a true liquid state during extrusion. Not completely separated, as they would be in a true solution, the polymer chains are bound together at various points in liquid crystal form. This produces strong inter-chain forces in the resulting filaments that can significantly increase the tensile strength of the fibers. In addition, the liquid crystals are aligned along the fiber axis by the shear forces during extrusion. The filaments emerge with an unusually high degree of orientation relative to each other, further enhancing strength. The process can also be described as dry-wet spinning, since the filaments first pass through air and then are cooled further in a liquid bath.

Conductive metal materials in powder form usable in the process of the present invention are those known by those in the electronics industry. Examples of suitable conducting metals, include those commonly used in solar devices, are as follows: Au, Ni, Au/Cr, Au/Cu, Au/Ta, Cu/Cr, Au/indium tin oxide, Cu, Ag and Ni. Ag is the preferred conducting metal.

Fibers or ribbons comprising 70–80% conductive metal particles by weight are preferred; although, inorganic particle loading up to 90% by weight is suitable. Maximizing the inorganic solids loading will minimize shrinkage of the fibers during firing. However the polymer content must be kept high enough to form a flexible and uniform fiber or ribbon.

The method of affixing the formed fiber or ribbon to the solar cell surface (substrate) may be any method ranging from manual placement to mechanized placement means. The solar cell surface may be any surface suitable for use in solar cell manufacturing, but the preferred surfaces are processed Si wafers, CuInSe substrates, or substrates covered with thin films of amorphous silicon, CD-In-Ga-Se, CdS, ZnS, or CdTe.

After placement of the fiber or ribbon, the first heating stage heats the solar cell structure that holds the affixed fiber or ribbon to a temperature above the melting point of the organic polymer component of the fiber or ribbon. This adheres the inorganic material/polymer fiber or ribbon to the substrate material. In one embodiment the heating source may be incorporated into a press plate. In another embodiment the heating source may be independent of the press plate.

A second heating stage which substantially to completely burns out the organic polymer from the fiber or ribbon results in the inorganic material adhering to the substrate material. It is preferred that the conductive inorganic materials are sintered. The firing temperature profile may be the two heating stages carried out in one continuum of heating or two discretely staged heating events. For example, the fiber and/or ribbon placement and initial heating stage can be combined. Heating either the substrate and/or fiber/ribbon during the placement step can be used to secure the fiber/ribbon in the required position on the substrate. This would be the preferred positioning method to create functional features where there is no mechanical support structure to hold the fiber and/or ribbon in place. Another alternative method to tack fibers and/or ribbons in place without heating would be to wet the fiber or substrate surface with solvent vapors immediately before positioning (to make the fiber stick to the substrate).

More specifically, FIG. 1 illustrates a top surface metallization by the placement of multiple fine fibers (101) of conductive material onto a solar cell.

The fibers are very narrow having dimensions of about 20 to 80 microns in width. The fibers can be extruded as either circular rods or rectangular shaped ribbon. Their aspect ratio may typically be about 1.

Figure 2:
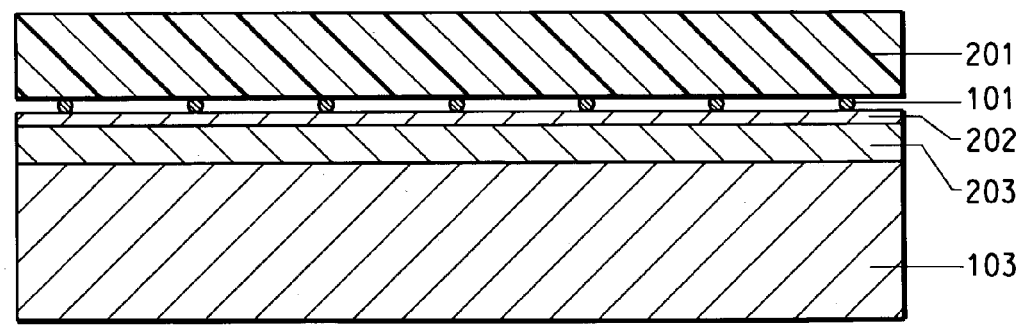
FIG. 2 is a cross sectional illustration of FIG. 1 with a press plate.

The fibers may be placed by a fixture such as a loom (102) and positioned over the solar cell substrate such as a processed crystalline Si wafer (103). Proper positioning will need to be done accurately (X-Y positioning shown in FIG. 1). A cross-sectional view of FIG. 1 is shown in FIG. 2. FIG. 2 positions the fibers close to the Si wafer surface prior to pressing with a heated TEFLON® plate (201).

Fiber number and spacing will vary as a function of solar cell design. Some designs may have close spaces between lines as illustrated in FIG. 1. Some designs may have wider spaces between lines.

The placement of fibers is a critical operation. The narrow fibers will need support, as they may be fragile. They will need to be positioned accurately with repeated performance.

Once the fibers are placed onto or above the cell, a press plate may both press and heat the fibers to stick them to the cell surface (FIG. 2). The TEFLON® plate will not grip the fibers thereby allowing the plate to be removed without pulling on the fibers. Prior to lifting the plate the fibers will typically be cut. In another embodiment, an independent heating source may be used from the underside of the cell.

The cell has a thin film antireflective coating of SiNx (202) on its upper surface. Under the SiNx is a diffused layer of n+Si (203)(typically Si with high concentration of P n-type dopant [for a negative emitter]). The base of the cell is p-type Si (103).

Figure 3:
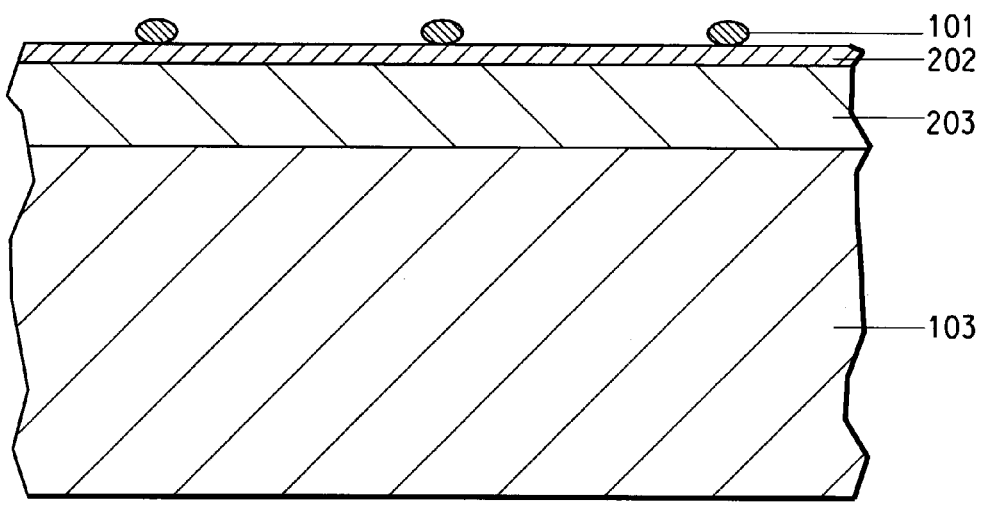
FIG. 3 is an illustration showing fiber placement after processing.

FIG. 3 shows the cell cross section of FIG. 2 after the press plate is removed. The fibers (101) have been deformed slightly during pressing and heating and have been made to adhere to the top of the SiNx layer (202) (the outermost surface of the cell).

Figure 4:
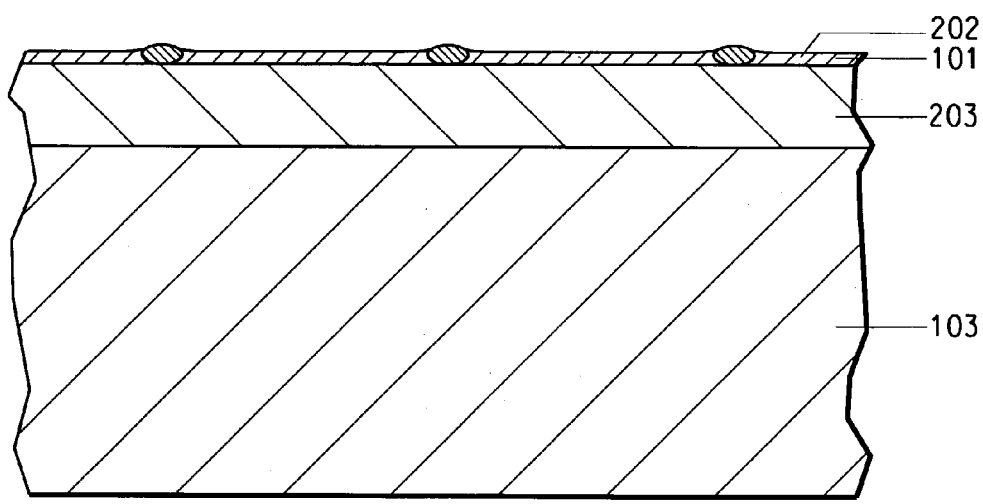
FIG. 4 is an illustration of the solar cell structure after firing.

FIG. 4 illustrates the cell cross section of FIG. 3 but after firing the fibers (101). The fibers contact the n+Si layer (203) by penetrating the SiNx layer (202). This is necessary, as the SiNx is a non-conducting layer. FIG. 4 also illustrates the fibers remaining in the same X-Y position after firing.

EXAMPLES

Example 1

A smooth fiber forming paste containing silver particles was made as follows. 5.0 g ELVAX® 265 ethylene vinyl acetate resin (DuPont, Wilmington, Del.) was first soaked with 30 ml tetrachloroethylene (TCE) in a 100 ml beaker for one half hour. The beaker wrapped with a round band heater was enclosed in a bell jar. An air-driven stirrer was situated at the center of the bell jar for stirring the mixture in the beaker. The mixture was heated to 100° C. until the polymer dissolved. To the solution, 15.0 g silver powder (silver powder, nominal size ~2 um D50 [~0.5 um D10, ~7 um D90] available from E. I. du Pont de Nemours and Company, Wilmington, Del.) and 0.4 g glass frit were added. It was stirred for about four hours. Once the mixture looked very smooth, vacuum was applied to the bell jar to thicken the mixture until an extensible viscosity was obtained. The mixture was then tested with a spatula to ascertain that fiber could be pulled from the smooth, thick paste. Once a smooth, fluid mixture was achieved, it was transferred to a plastic syringe having a ~0.5 mm diameter hypodermic needle for extrusion. The paste had to be kept at ~80° C. while it was being extruded to TEFLON®) fluoropolymer sheets (DuPont, Wilmington, Del.) for forming continuous fibers. Fibers ranging from 100 to 300 microns were obtained. The obtained fibers were elastic and could be handled easily without breaking, which makes it possible for further processing. Thin ribbons down to 50 microns in thickness were obtained if the extrudates came into contact with the TEFLON® fluoropolymer sheets (DuPont, Wilmington, Del.) before the skin of the extrudate had solidified.

Glass Frit Composition (given in weight %)

$Bi_2O_3$ 82.0
PbO 11.0
$B_2O_3$ 3.5
$SiO_2$ 3.5

Milled to nominal S.A. of 5.5 $m^2/g$

Example 2

The silver fibers from Example 1 were affixed to a silicon wafer and fired at 900 C (set point) in an IR furnace. The fibers did not retain their original dimensions. The fired fibers measured 40 microns×8 microns high.

What is claimed is:

1. A process to attach fibers or ribbons to a substrate, for the transfer of inorganic material to the substrate, for use in the manufacture of a solar cell structure comprising the steps of:
    a) affixing a fiber or ribbon comprising an organic polymer and an inorganic material to a substrate in a desired orientation forming a solar cell structure and
    b) heating the structure to a temperature sufficient to effect removal of the organic polymer resulting in the inorganic material being affixed to the substrate in the desired orientation.

2. The process of claim 1 further comprising forming a fiber or ribbon comprising an organic polymer and an inorganic material destined for deposition on a substrate.

3. The process of claim 1 wherein the inorganic material is conducting metal particles selected from Au, Ni, Au/Cr, Au/Cu, Au/Ta, Cu/Cr, Au/indium tin oxide, Cu, Ag and Ni.

4. The process of claim 2 wherein the substrate is a silicon wafer.

5. The process of claim 1 further comprising a step of: heating the substrate to a temperature above the melting point of the organic polymer.

6. The process of claim 1 wherein the fiber or ribbon is deposited on the solar cell structure as an electrode.

* * * * *